(12) United States Patent
Fattal et al.

(10) Patent No.: US 7,692,135 B2
(45) Date of Patent: Apr. 6, 2010

(54) WDM SIGNAL DETECTOR

(75) Inventors: David Fattal, Mountain View, CA (US); Wei Wu, Palo Alto, CA (US); Raymond Beausoleil, Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/262,359

(22) Filed: Oct. 31, 2008

(65) Prior Publication Data

US 2009/0273049 A1 Nov. 5, 2009

Related U.S. Application Data

(60) Provisional application No. 61/125,927, filed on Apr. 30, 2008.

(51) Int. Cl.
*G02B 6/34* (2006.01)
*H04B 10/08* (2006.01)

(52) U.S. Cl. .............. 250/214.1; 250/227.23; 250/227.24; 385/12; 385/37; 398/87

(58) Field of Classification Search .............. 250/214.1, 250/227.23, 227.24; 257/432; 385/12, 28, 385/30, 37; 398/37, 84, 87, 79
See application file for complete search history.

(56) References Cited

U.S. PATENT DOCUMENTS

| 5,026,148 | A | * | 6/1991 | Wen et al. ................ 359/483 |
|---|---|---|---|---|
| 5,051,790 | A | * | 9/1991 | Hammer .................. 257/80 |
| 6,594,422 | B2 | * | 7/2003 | Taylor et al. .............. 385/37 |
| 7,466,410 | B2 | * | 12/2008 | Sigalas et al. ............. 356/328 |
| 2002/0041734 | A1 | * | 4/2002 | Worchesky et al. ........ 385/37 |
| 2005/0237475 | A1 | * | 10/2005 | Chou et al. ............... 349/198 |
| 2007/0122148 | A1 | * | 5/2007 | Welch et al. .............. 398/27 |

OTHER PUBLICATIONS

Rosenblatt et al., Resonant Grating Waveguide Structures, IEEE Journal of Quantum Electronics, vol. 33, No. 11, Nov. 1997, 22 pages.
Schaadt et al., Enhanced semiconductor optical absorption via surface plasmon excitation in metal nanoparticles, Applied Physics Letters 86, 2005, 3 pages (Feb. 2, 2005).
Avrutsky et al., Reflection of a beam of finite size from a corrugated waveguide, Journal of Modern Optics, 1989, vol. 36, No. 11, 1527-1539 (13 pages).
Wang et al., Theory and applications of guided-mode resonance filters, Applied Optics, vol. 32, No. 14, May 10, 1993, 8 pages.
Thurman et al., Controlling the spectral response in guided-mode resonance filter design, Applied Optics, vol. 42, No. 16, Jun. 1, 2003, 9 pages.

* cited by examiner

*Primary Examiner*—John R Lee

(57) ABSTRACT

A detector includes a light detecting layer and a grating structure. The light detecting layer, which can be a photodiode, has an optical mode that resonates in the light detecting layer, and the grating structure is positioned to interact with the optical mode. The grating structure further couples incident light having a resonant frequency into the optical mode, and causes destructive interference to prevent light having the resonant frequency from escaping the detecting layer. The light detecting layer can be made transparent to light having other frequencies, so that a stack of such detectors, each having a different resonant frequency, can be integrated into a WDM detector that is compact and efficient.

14 Claims, 2 Drawing Sheets

WDM SIGNAL DETECTOR

CROSS-REFERENCE TO RELATED APPLICATION

The present application claims priority from provisional application Ser. No. 61/125,927, filed Apr. 30, 2008, the contents of which are incorporated herein by reference in their entirety.

BACKGROUND

Systems for detecting and demodulating wavelength division multiplexed (WDM) optical signals have conventionally deployed one of two approaches. One approach spatially separates the frequency components of the optical signal using an optical element such as a diffraction grating so that the frequency components traverse physically different paths to separate detectors. The separate detectors can then decode, demodulate, or otherwise convert the separated frequency components into respective electrical signals. A disadvantage of this approach is that the system must be relatively large to provide space for the separate optical paths and detectors. Another approach employs an array of detectors that are individually much smaller than the cross-section of the WDM signal. A different filter is positioned adjacent to each detector, so that each detector demodulates or converts only a single frequency component that the adjacent filter passes. A disadvantage of this approach is waste of optical power. In particular, the WDM signal must have a cross-section that is large enough to cover the area of multiple detectors, and each detector uses only a small fraction of the light incident on the area of the detector.

Resonant grating waveguide structures have been of interest for light separation and filtering. These structures employ gratings to couple specific wavelengths of incident light into waveguides. A simple configuration for a resonant grating waveguide includes a waveguide layer and a grating layer. The grating layer transmits a part of an incident light beam and diffracts a part of the incident light beam. The diffracted part enters the waveguide layer but through interaction with the grating layer can diffract out of the waveguide layer and interfere with the directly transmitted light. A resonant grating waveguide structure is designed to have a "resonance" such that incident light having a resonant frequency is coupled into the waveguide structure with high efficiently, while incident light at a non-resonant frequency passes through waveguide structure unaltered. The resonant frequency and the bandwidth of the resonance generally depend on the features of the grating and the waveguide layer. However, the bandwidth can be made sufficiently narrow for use in optical filters or separators.

A detector for WDM signals is desired that is compact and efficient in the use of optical power.

SUMMARY

In accordance with an aspect of the invention, a detector includes a light detecting layer and a grating structure. The light detecting layer has an optical mode that resonates in the light detecting layer, and the grating structure is positioned to interact with the optical mode. The grating structure also couples incident light having a resonant frequency into the optical mode and causes destructive interference to reduce or prevent transmission of light with the resonant frequency through the light detecting layer. The detector can be made transparent to non-resonant frequencies, so that a stack of such detectors, each having a different resonant frequency, can be integrated into a compact WDM detector.

BRIEF DESCRIPTION OF THE DRAWINGS

Use of the same reference symbols in different figures indicates similar or identical items.

DETAILED DESCRIPTION

In accordance with an aspect of the current invention, a wavelength division multiplexed (WDM) signal detector can include a stack of detector layers with each detector layer confining a different optical mode and measuring a WDM signal component corresponding to the confined mode. Each detector layer may contain a grating structure able to separate a target frequency component from incident light and confine the separated frequency component in an optical mode residing in or around a photodiode or other light detecting structure. In particular, the resonant light separated from a WDM signal can be trapped for a prolonged period of time (determined by the quality of the resonance) or equivalently can produce a greatly enhanced electric field in the vicinity of the detecting structure. Since only the resonant frequency of light is trapped, the efficiency of the detecting structure for detection of the light having the resonant frequency will be greatly enhanced compared to the efficiency at which non-resonant wavelengths are detected. Each detector layer in a stack can be further designed to transmit most non-resonant light to lower layers of the stack and to absorb most of the resonant light. As a result, different wavelength components of an incident WDM signal are detected at different depths in the stacked WDM detector. The WDM signal is not required to have a beam cross-section that is larger than the area of the WDM detector, and the WDM detector efficiently uses a high percentage of the incident light having each of the resonant frequencies.

Figure 1A:
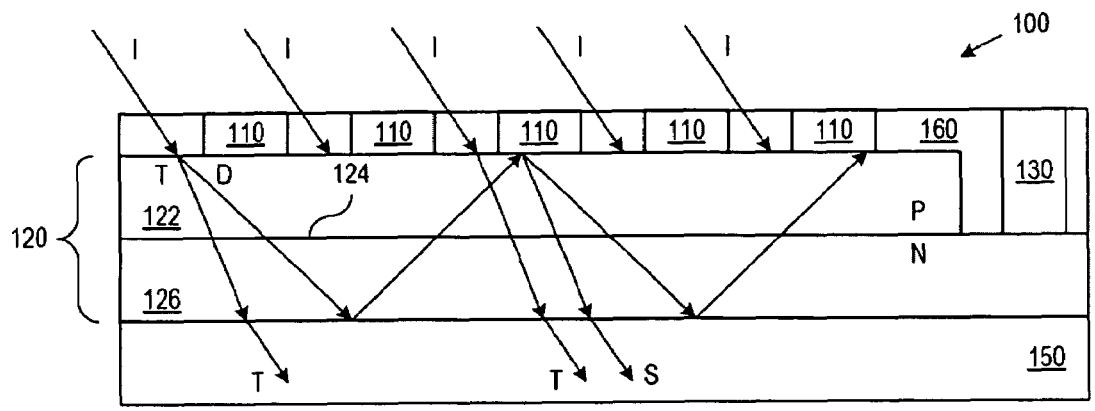
FIGS. 1A and 1B respectively show a cross-sectional view and a top view of a detector layer in accordance with embodiments of the invention using a PN junction.

FIG. 1A shows a cross-section of a detector layer 100 in accordance with an embodiment of the invention. Detector layer 100 includes a grating structure 110 and a detecting structure 120 that may be constructed from multiple layers formed using integrated circuit processing techniques. In operation, a light beam I, which is incident on detector layer 100, may contain light of multiple frequencies but particularly contains light having a frequency sometimes referred to herein as the resonant frequency of detector layer 100. As described further below, detector layer 100 is designed to be highly efficient at detecting light that has the resonant frequency and at transmitting light having other frequencies. Light beam I is preferably a collimated beam but more generally has a beam divergence angle that is within the acceptance angle of detector layer 100. Generally, structures having a broad resonance will have large acceptance angle. Beam I also has an angle of incidence selected according to design of the detector layer 100, but in a typical configuration, light beam I would be incident normal to the surface of detector layer 100 Light beam I is illustrated in FIG. 1A as being incident at an angle that helps to conceptually illustrate interfering rays.

Grating structure 110 is transparent but creates a refractive index variation in a pattern with dimensions selected to create interference effects at least for the resonant frequency of detector layer 100. FIG. 1 shows patterned structure 110 as being a separate layer overlying detecting structure 120, but patterned structure 110 may alternatively be incorporated within or underlie detecting structure 120. For example, grating structure 110 may incorporated in detecting structure 120 as a set of holes or doped or oxidized regions, so that an additional or separate layer is not required for grating structure 110.

Figure 1B:
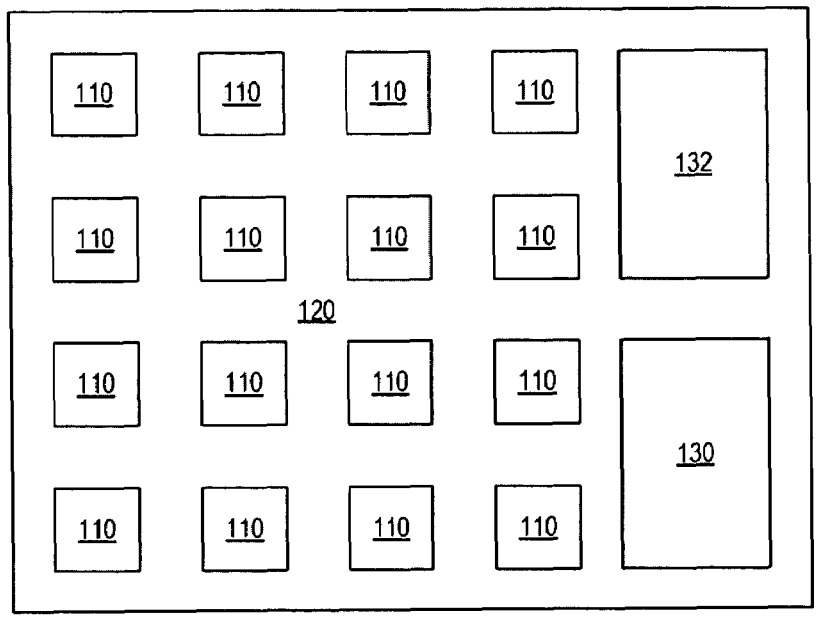

In an exemplary embodiment, grating structure 110 is a transparent diffraction grating. FIG. 1B illustrates a top view of detector layer 100 in an embodiment where grating structure 110 is a rectangular array of regions having a refractive index that differs from the refractive index of surrounding material. Other types of grating patterns could also be employed. For example, a grating with a hexagonal lattice could be used. A line grating might be employed in an embodiment where detector layer 100 measures light with a specific polarization and specific frequency since interference effects of a line grating differ depending on the orientation of a linear polarization of incident light relative to the direction of lines forming the grating. In general, any structure providing a periodic perturbation in refractive index could be used. The pattern required for grating structure 110 can be formed using conventional integrated lithographic masking techniques for patterned etching, doping, oxidation, or other treatment of detecting structure 120 or a separate layer formed above or below detecting structure 120.

Grating structure 110 splits incident light I into directly transmitted light T and diffracted light D as shown in FIG. 1A. Detector layer 100 is generally made thinner than a wavelength of the light of interest, so that the amount of light reflected from detector layer 100 is small. Transmitted light T passes through detecting structure 120, but detecting structure 120 is surrounded by material 150 and 160 having a lower refractive index so that diffracted light D can be trapped in a confined optical mode in and around detecting structure 120. Grating structure 110, which is located in detecting structure 120 or outside detecting structure 120 in an evanescent field of the confined optical mode, interacts with diffracted light D causing secondary diffraction. This secondary diffraction directs light S out of detecting structure 120. Directly transmitted light T and secondary diffracted light S, which exit detecting structure 120 can interfere. For light of the resonant frequency of detector layer 100, combination of transmitted light T and secondary light S results in complete destructive interference, so that the escape of light of the resonant frequency through the bottom surface detector layer 100 is limited or prevented. Detector layer 100 thus has a confined mode where light of the resonant frequency remains in detecting structure 120 for an extended period. Light having non-resonant frequencies are not confined in detecting structure 120 and are transmitted through detector layer 100.

The dimensions, pattern, and refractive index of grating structure 110 and the thickness and refractive index of detecting structure 120 determine the relative amplitude and phase of transmitted light T and secondary diffracted light S and can be selected to create a resonance at a desired frequency. Rules for selecting the structural parameters need to produce a desired resonance are substantially the same as those known for resonant grating waveguide structures. For example, resonant grating structures such as described by Thuman et al., "Controlling the Spectral Response in Guided-Mode Resonance Filter Design," Applied Optics, Vol. 42, No. 16, pp 3225-3233, (2003), which is hereby incorporated by reference in its entirety, could be altered to use detecting structures 120 in place of waveguides.

Detecting structure 120 in detector layer 100 is a photodiode including a layer 122 of P-type semiconductor material that forms a PN junction 124 with a layer 126 of N-type semiconductor material. Detecting structure 120 can alternatively employ other light detecting structures that provide similar optical characteristics, e.g., the same optical path length. The total thickness of detecting structure 120 is selected according to the desired resonant frequency of detector layer 100 as described above but typically will be a fraction of a wavelength or about 10 nm to 100 nm for visible light.

Trapping of the incident light of the resonant frequency in a confined mode in and around detecting structure 120 greatly enhances the efficiency with which detecting structure 120 absorbs light of the resonant frequency. The enhancement of detection efficiency of the resonant wavelength results because the confined light produces a strong electric field in detecting structure 120 or equivalently, because photons that are trapped in detecting structure 120 have more time to cause photoelectric effects in detecting structure 120. Detector layer 100 is thus highly efficient at absorbing and detecting light having a frequency corresponding to the resonant frequency of detector layer 100. Generally, a best condition for absorption comes at a critical coupling, where the rate of energy transfer between the incident light mode I and the confined mode is equal to the rate of energy dissipation, including scattering and absorption, of the confined mode. Under the critical coupling, the resonant component of the incident light beam will be completely dissipated in detecting structure 120. If the rate of absorption is on the order of the scattering rate by grating structure 110, almost 100% of the incident resonant light can be absorbed in detecting structure 120 to create electron hole pairs.

Electron-hole pairs created in detecting structure 120 are swept to respective electrodes by the biasing of junction 124. Detector layer 100 when connected to a circuit (not shown) through contact structures 130 and 132 can thus generate a current having a magnitude that indicates the intensity of the component of incident light having the resonant frequency.

One fabrication process for detector layer 100 begins with growing or depositing a layer of N-type silicon to form semiconductor layer 126. Semiconductor layer 126 would generally be grown on a substrate 150 that provides a base layer of a material such as silicon dioxide having a refractive index lower than that of layer 126. Thin layers of semiconductor material such as Ge, SiGe, $In_xGa_{1-x}As_yP_{1-y}$ (where x, y depends on the desired resonant wavelength) with insitu doping can be grown or deposited with tightly controlled thicknesses in the required range (e.g., 10 nm to 100 nm) using known techniques such as LPCVD, MOCVD, MBE. The pattern of grating structure 110 or detecting structure 120 may be fabricated using techniques such as photolithography, electron-beam lithography, and nanoimprintlithography, but other techniques could alternatively be used. Layer 126 can uniformly cover an area for reception of light and may further extend laterally for contact structure 130. P-type semiconductor is deposited on layer 126 to form semiconductor layer 122 and to create the PN junction 124. Like layer 126, layer 124 can uniformly cover the area for reception of light and may extend laterally for electrical contacts 132. A layer of dielectric (such as $Si_3N_4$) about 5 nm to 500 nm thick can then be deposited on layer 122 and patterned using photolithography, electron-beam lithography, nanoimprintlithography, etching, or other suitable processes to form grating structure 110. Alternatively, grating structure 110 can be formed by patterned, etching, oxidation, or other treatment of layer 122 or 114. An insulating material 160 such as an oxide which has a refractive index that is lower than semiconductor layer 122 and different from grating structure 110 can then be deposited on grating structure 110 and semiconductor layer 122. Conventional processing techniques can form electrical contacts 130 and 132 through insulating material 160 to provide electrical connections respectively to layers 126 and 122.

Figure 2:
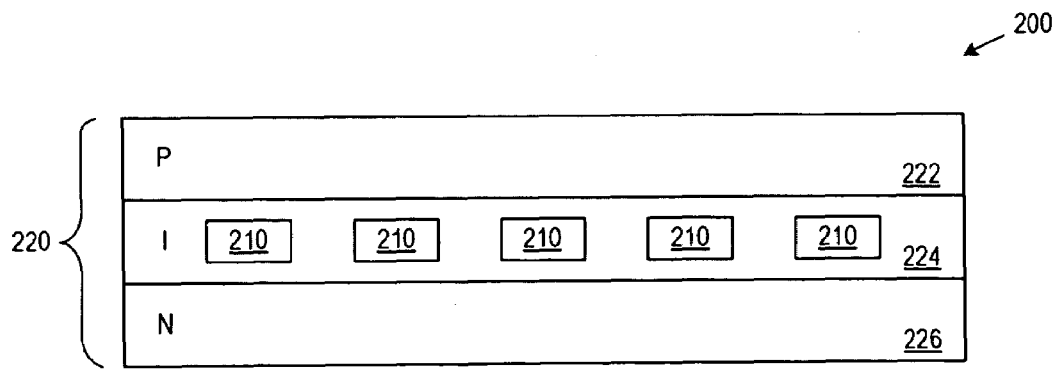
FIG. 2 shows a cross-sectional view of a detector layer in accordance with embodiments of the invention using a PIN junction.

FIG. 2 shows a cross-sectional view of a detector layer 200 employing a grating structure 210 within a detecting structure 220. In the embodiment of FIG. 2, detecting structure 220 is a PIN photodiode including a P-type semiconductor layer 222, an intrinsic semiconductor layer 224, and an N-type semiconductor layer 226. Grating structure 210 is formed in detecting structure 220 and particularly in intrinsic semiconductor layer 224 in the illustrated embodiment. Grating structure 210 could alternatively be in dope semiconductor layer 222 or 226.

One fabrication process for detector layer 200 begins with depositing a layer of N-type silicon or other suitable semiconductor material to form semiconductor layer 226 on a substrate (not shown) that provides a base layer of a material such as silicon dioxide having a refractive index lower than that of layer 226. Intrinsic layer 224 can then be deposited on layer 226, and grating structure 210 can be formed in semiconductor layer 226 using a variety of alternative techniques. With one approach, a pattern of openings are etched in layer 226 and filled with a material having a refractive index that differs from that of layer 226. Alternatively, areas of intrinsic semiconductor layer 224 can be oxidized, doped, or otherwise treated to alter the refractive index in the regions corresponding to grating structure 210. For example, oxygen ion implantation, which is similar to SIMOX technology for SOI, can be use to create oxide regions. P-type silicon is then grown or deposited on intrinsic layer 224 to form layer 222. Chemical mechanical polishing (CMP) can be applied during the fabrication process to improve planarity if necessary.

Figure 3:
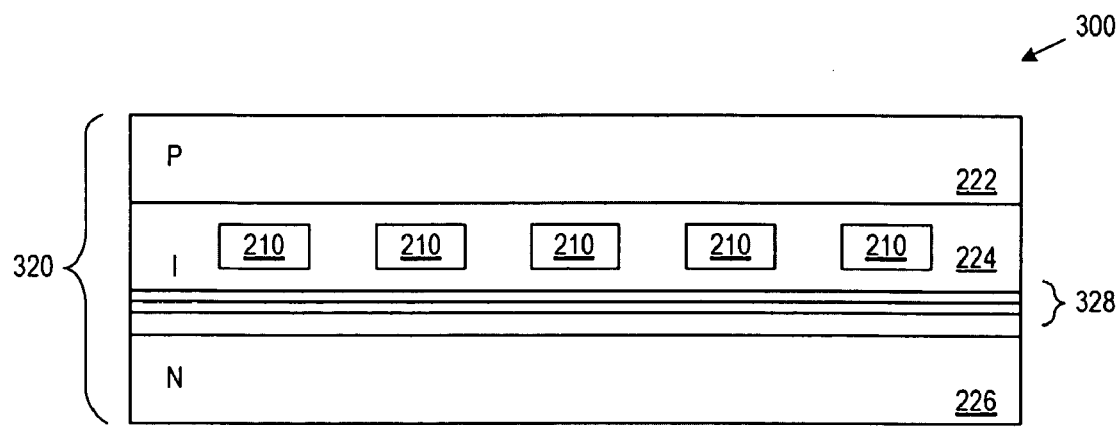
FIG. 3 shows a cross-sectional view of a detector layer in accordance with embodiments of the invention using a PIN junction with quantum wells.

FIG. 3 shows a cross-sectional view of a detector layer 300. Detector layer 300 includes a grating structure 210, a P-type semiconductor layer 222, an intrinsic semiconductor layer 224, and an N-type semiconductor layer 226 that are substantially as described above in regard to FIG. 2. Detector layer 300 differs from detector layer 200 in that detecting structure 320 of detector layer 300 includes quantum wells 328 in intrinsic layer 224. As is known in the art, quantum wells 328 are regions having lower energy quantum states for electrons or holes, and the presence of quantum wells 328 can increase the detection efficiency of detecting structure 320 by providing regions with a high concentration of electron/hole states that are accessible at the energy of the photons to be detected.

Figure 4:
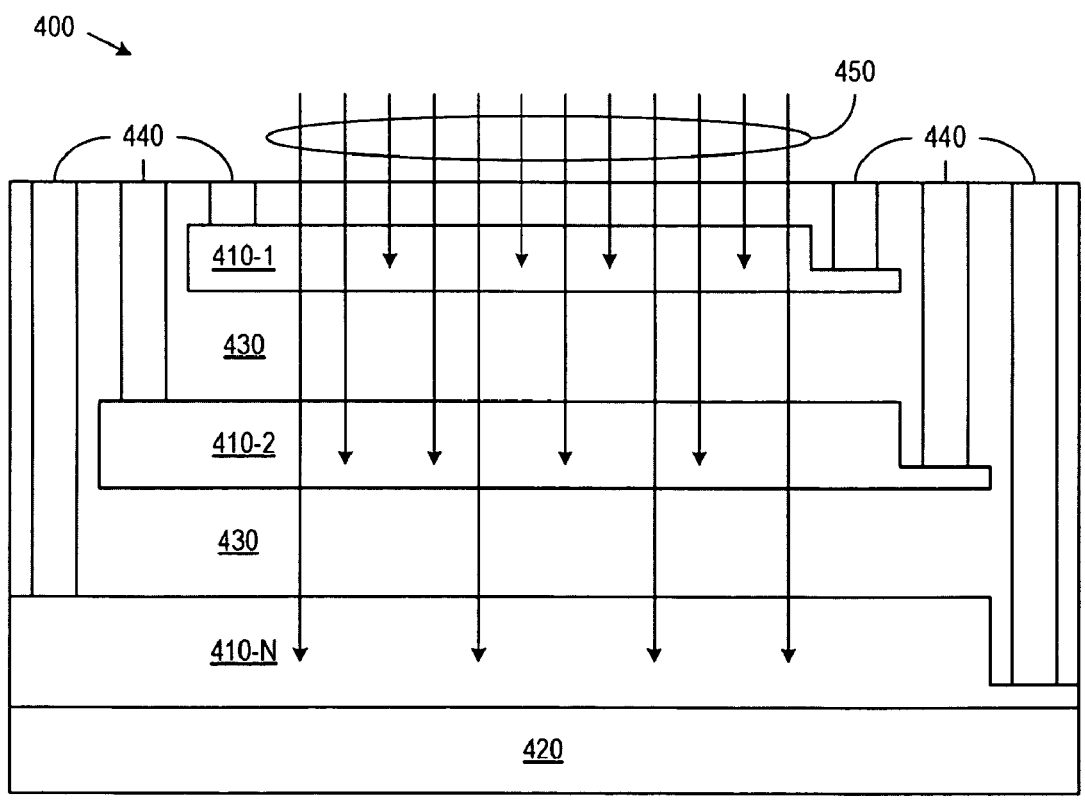
FIG. 4 shows a cross-sectional view of a stacked wavelength division multiplexed signal detector in accordance with an embodiment of the invention.

FIG. 4 illustrates an example of a WDM detector 400 in accordance with an embodiment of the invention containing multiple detector layers 410-1 to 410-N, generically referred to herein as detector layers 410. Each detector layer 410 may be structurally the same as a detector layer 100, 200, or 300, as described above. Detector layers 410 are formed in a stack on a substrate 420 and separated from each other by layers of transparent insulating material 430. Contact structures 440 are formed through insulator material 430 for electrical connection to detector layers 410.

Detector layers 410 differ from each other in dimensions (e.g., thickness or grating structure) or composition so that each of detector layers 410-1 to 410-N has a different resonant wavelength. In particular, if detector 400 is designed to detect or demodulate a WDM optical signal 450 containing components with frequencies $f_1$ to $f_N$, detector layers 410-1 to 420-N have resonances respectively corresponding to frequencies $f_1$ to $f_N$. In operation, WDM signal 450 is directed onto to the surface of detector 400 and passes into a first detector layer 410-1. Detector layer 410-1 captures the component of signal 450 having frequency $f_1$. Detector layers 410 are all thin (e.g., less than the wavelengths of light in WDM signal 450) and are nearly transparent to non-resonance frequencies. In particular, detector layer 410-1 is transparent the components of WDM signal 450 having frequencies $f_2$ to $f_N$. Detector layer 410-1 when connected to an external circuit thus can produce a signal that is proportional to the intensity of the light component having frequency $f_1$. The components of WDM optical signal 450 having the other frequencies $f_2$ to $f_N$ are absorbed at different depths in respective detector layers 410-2 to 410-N, so that detectors 410-2 to 410-N generate signals that respectively indicate the intensity of WDM signal components with frequencies $f_2$ to $f_N$.

WDM detector 400 has several advantages. In particular, WDM detector 400 is compact and can be fabricated using integrated circuit manufacturing techniques, rather than requiring assembly of separate optical components such as filters or separators with electrical components such as photodiodes. WDM 400 also enables efficient signaling with a WDM optical signal having a beam profile that is smaller than the area of detector 400, and a large portion of the optical energy is converted to electrical signals.

Although the invention has been described with reference to particular embodiments, the description is only an example of the invention's application and should not be taken as a limitation. For example, particular orders of layers and doping for specific embodiments of the invention have been described, but it will be understood by those skilled in the art that those configurations can be changed. Various other adaptations and combinations of features of the embodiments disclosed are within the scope of the invention as defined by the following claims.

What is claimed is:

1. A detector comprising:
   a first light detecting layer having a first optical mode that resonates in the first light detecting layer; and
   a first grating structure positioned to interact with the first optical mode, wherein the first grating structure couples incident light having a first resonant frequency into the first optical mode, and causes destructive interference to limit transmission of light with the first resonant frequency through the first light detecting layer.

2. The detector or claim 1, wherein the first light detecting layer comprises a P-type semiconductor layer and an N-type semiconductor layer that form a photodiode that absorbs light from the first optical mode.

3. The detector of claim 1, wherein the first light detecting layer comprises a P-type semiconductor layer, an intrinsic semiconductor layer, and an N-type semiconductor layer that form a PIN photodiode that absorbs light from the first optical mode.

4. The detector of claim 3, wherein the first light detecting layer further comprises quantum wells in the PIN diode.

5. The detector of claim 3, wherein the first grating structure resides in the intrinsic layer.

6. The detector of claim 1, wherein layers adjacent to the first light detecting layer have refractive indices that are lower than a refractive index of the first light detecting layer for confinement of the first optical mode.

7. The detector of claim 1, wherein the first light detecting layer has a thickness that is less than a wavelength of light having the first resonant frequency.

8. The detector of claim 1, wherein the first grating structure resides in an evanescent field of the first optical mode confined by the first light detecting layer.

9. The detector of claim 1, wherein the first grating structure lies within the first light detecting layer.

10. The detector of claim 1, further comprising:
a second light detecting layer able to confine a second optical mode; and
a second grating structure positioned to interact with the second optical mode, wherein the second grating structure couples into the second optical mode incident light having a second resonant frequency that is different from the first resonant frequency, and the second grating structure causes destructive interference to limit transmission of light with the second resonant frequency through the second light detecting layer.

11. The detector of claim 10, wherein the first light detecting layer and the second light detecting layer are stacked so that incident light having the second resonant frequency passes through the first light detecting layer to reach the second light detecting layer.

12. A WDM detector comprising a plurality of detector layers that are stacked with intervening transparent insulator layers, wherein each of the detector layers comprises:
a light detecting structure able to confine a resonant optical mode of the detector layer;
a grating structure positioned to interact with the resonant optical mode of the detector layer, wherein the grating structure couples incident light having a resonant frequency of the detector layer into the resonant optical mode of the detector layer, and causes destructive interference to limit transmission of light with the resonant frequency through the light detecting structure, wherein:
the resonant frequency of the detector layers differ from each other.

13. The detector of claim 12, wherein each of the detector layers is transparent to light having frequencies other than the resonant frequency of the detector layer.

14. The detector of claim 12, wherein each of the light detecting structures comprises semiconductor layers that form a photodiode.

* * * * *

UNITED STATES PATENT AND TRADEMARK OFFICE
CERTIFICATE OF CORRECTION

PATENT NO. : 7,692,135 B2  Page 1 of 1
APPLICATION NO. : 12/262359
DATED : April 6, 2010
INVENTOR(S) : David Fattal et al.

It is certified that error appears in the above-identified patent and that said Letters Patent is hereby corrected as shown below:

In column 6, line 51, in Claim 2, delete "or" and insert -- of --, therefor.

Signed and Sealed this

Ninth Day of November, 2010

David J. Kappos
*Director of the United States Patent and Trademark Office*